(12) United States Patent
Kashiwagi et al.

(10) Patent No.: US 7,103,866 B2
(45) Date of Patent: Sep. 5, 2006

(54) METHOD FOR DESIGNING SEMICONDUCTOR CIRCUIT DEVICE, UTILIZING BOUNDARY CELLS BETWEEN FIRST AND SECOND CIRCUITS DRIVEN BY DIFFERENT POWER SUPPLY SYSTEMS

(75) Inventors: Yoshiki Kashiwagi, Kanagawa (JP); Tetsuya Katoh, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 178 days.

(21) Appl. No.: 10/830,019

(22) Filed: Apr. 23, 2004

(65) Prior Publication Data

US 2004/0225985 A1 Nov. 11, 2004

(30) Foreign Application Priority Data

May 9, 2003 (JP) ............................. 2003-131472

(51) Int. Cl.
*G06F 17/50* (2006.01)
(52) U.S. Cl. ........................................... 716/10; 716/9
(58) Field of Classification Search ................. 716/10, 716/9
See application file for complete search history.

(56) References Cited

U.S. PATENT DOCUMENTS

| | | | | |
|---|---|---|---|---|
| 5,610,791 A * | 3/1997 | Voldman | ...................... | 361/56 |
| 6,140,864 A * | 10/2000 | Hirata et al. | ................. | 327/544 |
| 6,308,312 B1* | 10/2001 | Houston | ...................... | 716/17 |
| 6,603,219 B1* | 8/2003 | Toyama et al. | ............... | 307/38 |
| 6,941,534 B1* | 9/2005 | Fukasawa | ...................... | 716/8 |

FOREIGN PATENT DOCUMENTS

JP  2001-148625  5/2001

* cited by examiner

*Primary Examiner*—Jack Chiang
*Assistant Examiner*—Tuyen To
(74) *Attorney, Agent, or Firm*—Foley & Lardner LLP (57) ABSTRACT

To design a chip having a plurality of circuit areas driven by different power supplies, a boundary cell to be inserted on the boundary between the circuit areas is prepared. After creating a logic circuit netlist with a design tool, the boundary cell is inserted on the boundary. The boundary cell is connected on a signal transmission path between the circuit areas. A circuit for suppressing shoot-through current or leakage current is used as the boundary circuit. By preparing the boundary cell in a cell library, chip design is facilitated.

8 Claims, 8 Drawing Sheets

| INPUT | ENABLE | OUTPUT |
|-------|--------|--------|
| 0 | 1 | 0 |
| 1 | 1 | 1 |
| X | 1 | X |
| X | 0 | 1 |
| X | X | X |

| INPUT | ENABLE | M | OUTPUT |
|-------|--------|---|--------|
| 0 | 1 | 1 | 0 |
| 1 | 1 | 0 | 1 |
| X | 1 | X | X |
| X | 0 | 0 | 1 |
| X | X | X | X |

| INPUT | ENABLE | OUTPUT |
|-------|--------|--------|
| 0 | 1 | 0 |
| 1 | 1 | 1 |
| X | 1 | X |
| X | 0 | 1 |
| X | X | X |

| INPUT | ENABLE | OUTPUT |
|-------|--------|--------|
| 0 | 1 | 0 |
| 1 | 1 | 1 |
| X | 1 | X |
| X | 0 | 1 |
| X | X | X |

METHOD FOR DESIGNING SEMICONDUCTOR CIRCUIT DEVICE, UTILIZING BOUNDARY CELLS BETWEEN FIRST AND SECOND CIRCUITS DRIVEN BY DIFFERENT POWER SUPPLY SYSTEMS

BACKGROUND OF THE INVENTION

1. Field of the Invention

The present invention relates to a technique for designing a semiconductor circuit device, and particularly, to a technique for designing a semiconductor circuit device that enables more efficient design.

2. Description of the Related Art

With the progress of the communication technology and the semiconductor technology, mobile devices such as cellular phones and personal digital assistants (PDA) have spread widely. Typical mobile devices are driven by a rechargeable battery to comply with the portability. Some techniques for reducing power consumption of the mobile devices are developed to extend battery life and reduce charging frequency and time. One technique is to turn off or reduce a supply voltage to an unused circuit area of a chip so as to reduce unnecessary power consumption. To turn off or reduce a supply voltage to a specific circuit area, the circuit in the chip is divided into several circuit areas, each of which belongs to a different power system. Each power system may be controlled separately.

This kind of chip has a problem of shoot-through current between the circuit areas driven by different power supplies when one power supply is OFF. Some techniques to solve this problem have been developed, including the one disclosed in Japanese Unexamined Patent Application Publication 2001-148625, for example. According to this technique, a semiconductor integrated circuit has an input circuit operating by a first power supply and an output circuit operating by a second power supply with varying output voltages and having a CMOS inverter for supplying a High or Low level output signal to the input circuit. The output signal from the CMOS inverter of the output circuit is input to a control unit in the input circuit. If the second supply voltage is equal to or higher than a given voltage, the control unit outputs the output signal from the CMOS inverter as an internal signal of the input circuit. If the second supply voltage is less than the given voltage, on the other hand, the control unit outputs a Low level signal as an internal signal of the input circuit.

In this circuit structure, while the second power supply for the output circuit is OFF, the output of the control unit in the input circuit is kept Low, thereby preventing the shoot-through current from occurring in the input circuit. If the second power supply turns from ON to OFF when the output signal from the CMOS inverter is High, the output signal of the CMOS inverter turns from High to Low through an intermediate level. Since the output of the control unit turns to Low when the second supply voltage falls below the given voltage, no shoot-through current occurs in the input circuit. The power consumption is thereby reduced.

As described above, several circuit techniques to solve the problem in the different power supply circuit areas have been developed. However, the circuit design of the chip having a plurality of circuit areas in different power systems has not been addressed. Efficient and easy design is important particularly in the design of semiconductor circuit devices using a design system. Conventional design techniques, however, require a user to insert the circuit between the circuit areas after designing the different circuit areas. It is thus unable to perform efficient circuit design. Further, since the conventional design techniques insert the circuit between the circuit areas after separately designing the transmitting section and the receiving section of the different circuit areas, it is unable to control the line length, causing signal delay.

SUMMARY OF THE INVENTION

In view of the foregoing, it is an object of the present invention to provide a method for designing a semiconductor device more easily.

According to a first aspect of the present invention, there is provided a method of designing a semiconductor circuit device including the steps of generating first circuit data having information on a first circuit driven by a voltage from a first power system; generating second circuit data having information on a second circuit driven by a voltage from a second power system different from the first power system; obtaining cell data prestored in a storage medium and having information on a boundary circuit; and generating boundary circuit connection information indicating that the boundary circuit is connected on a transmission path between the first circuit and the second circuit. It enables more efficient design of a semiconductor circuit device. The order of the steps is not limited to the described order. This is the same in the following descriptions in this paragraph.

In the first aspect of the present invention, the boundary circuit preferably includes a circuit for suppressing shoot-through current between the first circuit and the second circuit when one of the first circuit and the second circuit is off and the other one of the first circuit and the second circuit is on. This enables effective design of a circuit for suppressing shoot-through current between circuits driven by different power supplies. Alternatively, the boundary circuit preferably includes a circuit for preventing circuit malfunction due to indeterminate current between the first circuit and the second circuit when one of the first circuit and the second circuit is off and the other one of the first circuit and the second circuit is on. This enables effective design of a circuit for preventing circuit malfunction due to indeterminate current between circuits driven by different power supplies.

In the first aspect of the present invention, the boundary circuit preferably includes a circuit for suppressing leakage current between the first circuit and the second circuit when one of the first circuit and the second circuit is off, and the other one of the first circuit and the second circuit is on. This enables effective design of a circuit for suppressing leakage current between circuits driven by different power supplies.

In the first aspect of the present invention, the boundary circuit preferably includes a circuit for level conversion between the first circuit and the second circuit. This enables effective design of a circuit for level conversion between circuits driven by different power supplies.

In the first aspect of the present invention, the boundary circuit preferably includes a protection circuit for protecting a transistor in the first circuit and/or the second circuit from ESD (electrostatic discharge). This enables effective design of a circuit for protection from ESD in between circuits driven by different power supplies.

In the first aspect of the present invention, the first circuit data, the second circuit data, and the cell data may be data for logic circuit design. Alternatively, the first circuit data, the second circuit data, and the cell data may be data for layout design.

According to a second aspect of the present invention, there is provided a semiconductor circuit device designed by the above described design method.

According to a third aspect of the present invention, there is provided a method of designing a semiconductor circuit device including the steps of designing a first circuit driven by a voltage from a first power system; designing a second circuit driven by a voltage from a second power system different from the first power system; and connecting a prepared cell on a line for transmitting signals between the first circuit and the second circuit. It enables more efficient design of a semiconductor circuit device.

According to a fifth aspect of the present invention, there is provided a computer-readable storage medium for storing a cell library used for semiconductor design, including a boundary cell having information on a boundary circuit connected on a signal transmission path between a first circuit driven by a voltage from a first power system and a second circuit driven by a voltage from a second power system different from the first power system. It enables more efficient design of a semiconductor circuit device.

According to a sixth aspect of the present invention, there is provided a design system for a semiconductor circuit device including a unit of generating first circuit data having information on a first circuit driven by a voltage from a first power system; a unit of generating second circuit data having information on a second circuit driven by a voltage from a second power system different from the first power system; a unit of obtaining cell data having information on a boundary circuit from the storage medium; and a unit of generating boundary circuit connection information indicating that the boundary circuit is connected on a transmission path between the first circuit and the second circuit. It enables more efficient design of a semiconductor circuit device.

The above and other objects, features and advantages of the present invention will become more fully understood from the detailed description given hereinbelow and the accompanying drawings which are given by way of illustration only, and thus are not to be considered as limiting the present invention.

DESCRIPTION OF THE PREFERRED EMBODIMENTS

Preferred embodiments of the present invention will be explained hereinafter with reference to the accompanying drawings.

Figure 1:
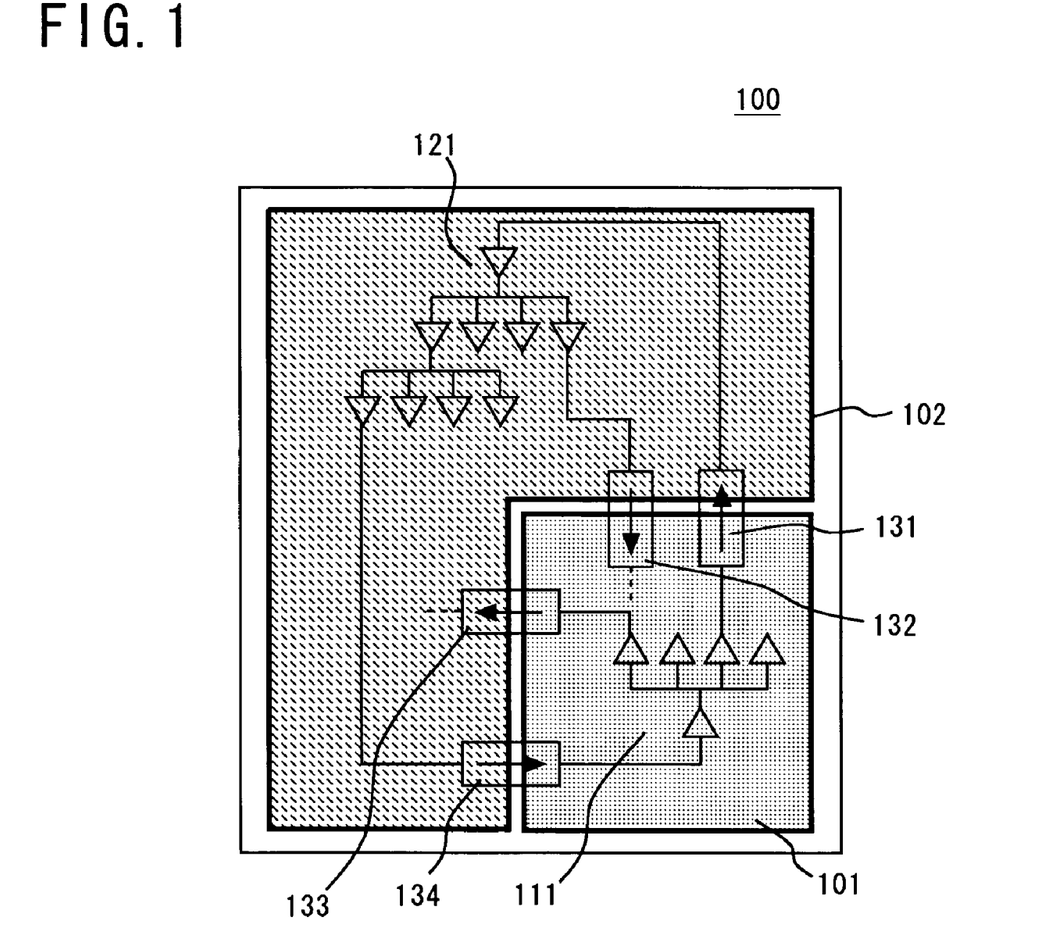
FIG. 1 is a chip image view showing the schematic structure of a semiconductor circuit device according to an embodiment of the present invention.

Referring first to FIG. 1, a chip image view showing the schematic structure of a semiconductor circuit device 100 according to an embodiment of this invention is shown. The semiconductor circuit device 100 includes a plurality of circuit areas where voltages are supplied by different power systems. FIG. 1 shows a first circuit area 101 operating by a first power system and a second circuit area 102 operating by a second power system. The first and second circuit areas may be viewed as electrical circuits. VDD 1 is supplied as a power supply voltage to the first circuit area, and VDD 2 is supplied as a power supply voltage to the second circuit area. The VDD 1 and VDD 2 may be at the same or different potential levels. These two voltages may be controlled separately.

A typical chip in this embodiment may be used for mobile devices such as cellular phones and PDA. In the mobile devices, voltage supply is off or a supply voltage is reduced in the circuit area not in use or operation. Such power supply control is possible in the circuit configuration having a plurality of circuit areas with different power supplies.

Alternatively, the configuration may be such that, in a chip including an analog circuit and a digital circuit, a supply voltage is supplied to each circuit by a different power system. In addition to these, the present invention may be applied to any semiconductor circuit devices with a plurality of circuit areas, each receiving a voltage from a different power system. Though FIG. 1 illustrates two circuits in different power systems, this invention is also applicable to the semiconductor circuit device with the circuit configuration having more than two different power systems.

The semiconductor circuit device 100 in FIG. 1 has a first internal circuit 111 formed in the first circuit area and a second internal circuit 121 formed in the second circuit area. Boundary circuits 131 to 134 are formed on the boundary between the first circuit area 101 and the second circuit area 102. The boundary circuits 131 to 134 are inserted on the lines connecting the first internal circuit 111 and the second internal circuit 121. The boundary circuits 131 to 134 are the circuits with appropriate functions and structures selected according to the circuit design. They are inserted on the signal lines between the circuit areas in different power systems.

Each of the boundary circuits 131 to 134 is configured as a single cell. Preparing the boundary circuit as a single cell allows improving the efficiency of circuit design. It also allows shortening the line length, thereby reducing signal delay. Preferred examples of the boundary circuit will be described in the following. For example, a circuit for avoiding undesirable current between circuits when one circuit is OFF, a level conversion circuit for use in the circuits with different drive voltages, and an ESD protection circuit will be shown as preferred examples.

Figure 2A:
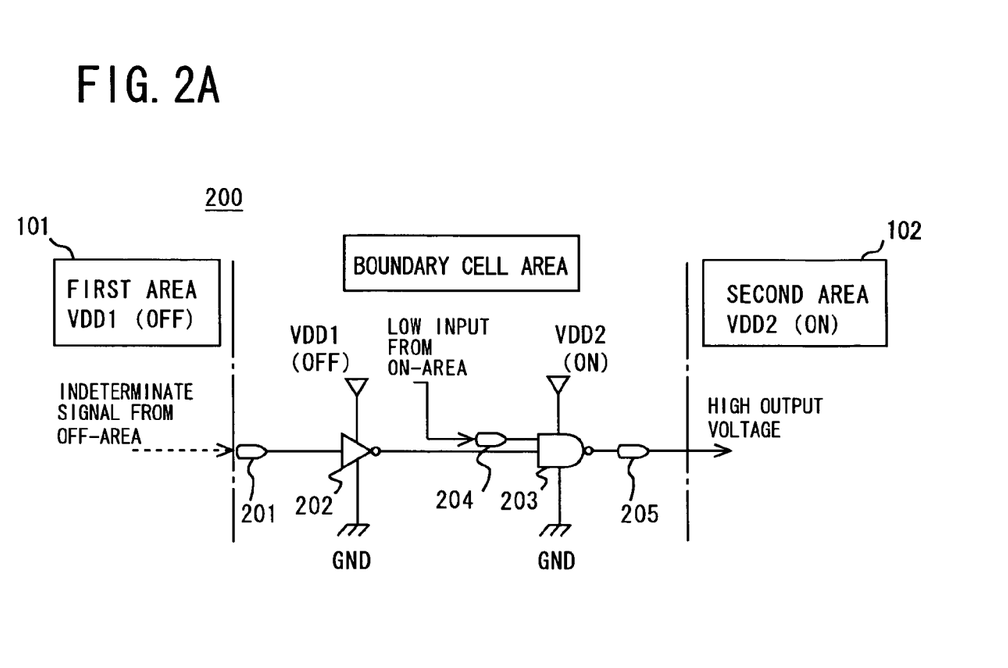
FIG. 2A is a logic circuit diagram showing a shoot-through current suppression circuit, which is an example of a boundary circuit according to an embodiment of the present invention.
Figure 2B:
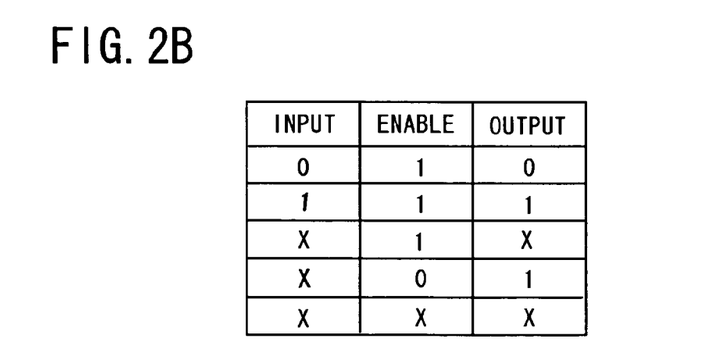
FIG. 2B is a truth table for the shoot-through current suppression circuit shown in FIG. 2A.

Referring now to FIGS. 2A and 2B, a shoot-through current suppression circuit 200 is shown as an example of the boundary circuit. FIG. 2A is a logic circuit diagram showing the circuit configuration of the shoot-through current suppression circuit 200. FIG. 2B shows a truth table for the shoot-through current suppression circuit 200. Use of the shoot-through current suppression circuit 200 can suppress the transmission of an indeterminate signal from a circuit area where power supply is OFF to a circuit area where power supply is ON. The use of this circuit can substantially prevent the indeterminate signal. This allows suppressing or preventing a shoot-through current to occur in the next-stage circuit to reduce the power consumption of the entire chip.

FIG. 2A shows a case where the first circuit area 101 is an OFF-state area and the second circuit area 102 is an ON-state area. The shoot-through current suppression circuit 200 includes an input terminal 201 where a signal from the internal circuit of the first circuit area 101 is input and an inverter 202 where the first supply voltage VDD 1 is supplied and the signal input to the input terminal 201 is sent. The output from the inverter 202 is input to a NAND gate 203. Also input to the NAND gate 203 is an enable signal sent from the internal circuit of the ON-state circuit area through an enable terminal 204. The NAND gate 203 operates by the second supply voltage VDD 2. The output from the NAND gate 203 is sent to the internal circuit of the second circuit area in the ON-state through an output terminal 205.

The operation of the shoot-through current suppression circuit 200 will be explained with reference to FIGS. 2A and 2B. FIG. 2B shows the relationship of an input signal "input" to the input terminal 201, an enable signal "enable" to the enable terminal 204, and an output signal "output" from the output terminal 205. The symbol "X" in the table indicates that a signal is indeterminate, "0" indicates that the output voltage is Low, and "1" indicates that the output voltage is High. If the first circuit area 101 is OFF, an indeterminate signal is input to the input terminal 201.

Specifically, if the first circuit area 101 is OFF, the output signal from the first circuit area 101 to the second circuit area 102 is indeterminate between High and Low. Thus, a signal with an intermediate voltage level is input to the second circuit area 102. This causes the shoot-through current to occur in the second circuit area 102. To prevent this, this embodiment controls the operation in such a way that the enable signal input to the NAND gate 203 is "0", which is "Low", when the first circuit area 101 is OFF.

By setting the enable signal to "0", it is able to determine and keep the output signal from the output terminal 205 to be "1", that is, the output voltage to be "High". As described above, if the circuit is OFF, its output is indeterminate between High and Low, and thus a signal with an intermediate voltage level between High and Low is input to the receiving circuit. The circuit configuration in this embodiment, however, can suppress the shoot-through current in the ON-state circuit area due to the indeterminate signal from the OFF-state circuit area.

If the first circuit area is ON, the shoot-through current suppression circuit 200 is controlled in such a way that the enable signal is "1". Thereby, if the input signal from the internal circuit of the first circuit area 101 to the input terminal 201 is "0", the output signal from the output terminal 205 to the internal circuit of the second circuit area 102 is determined to be "0", and if the input signal is "1", the output signal is "1". If the input signal is indeterminate and the enable signal is "1" or indeterminate, the output signal is indeterminate.

Figure 3A:
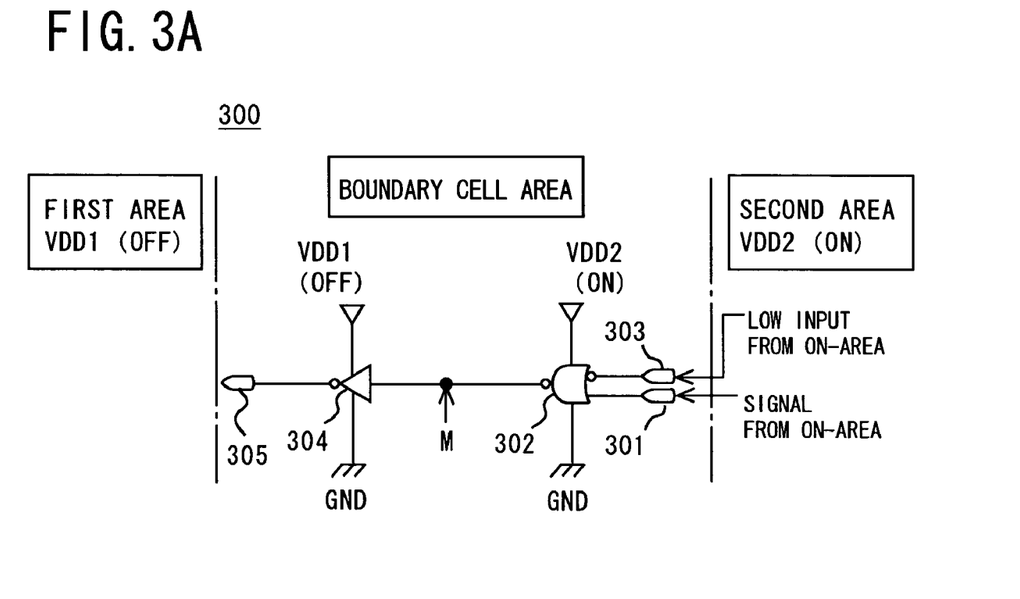
FIG. 3A is a logic circuit diagram showing a leakage current suppression circuit, which is an example of a boundary circuit according to an embodiment of the present invention.
Figure 3B:
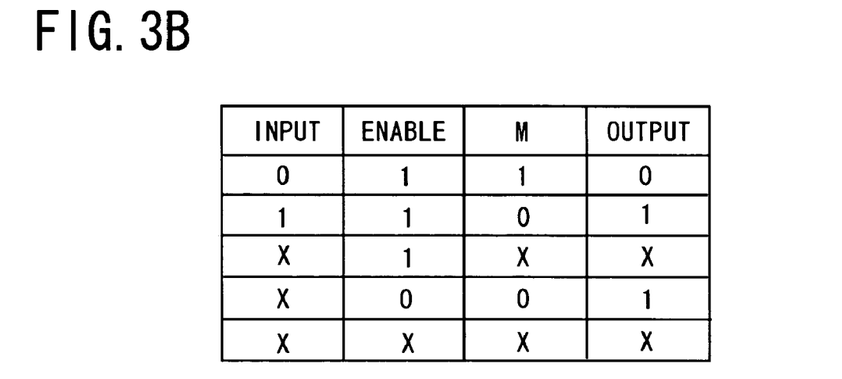
FIG. 3B is a truth table for the leakage current suppression circuit shown in FIG. 3A.

Referring then to FIGS. 3A and 3B, a gate leakage suppression circuit 300 is shown as another example of the boundary circuit. FIG. 3A is a logic circuit diagram showing the circuit configuration of the gate leakage suppression circuit 300. FIG. 3B shows a truth table for the gate leakage suppression circuit 300. Use of the gate leakage suppression circuit 300 allows the voltage on the boundary between the ON-state circuit area and the OFF-state circuit area to be kept Low. This enables suppression of gate leakage to reduce the power consumption of the entire chip. The use of this circuit can substantially prevent gate leakage.

FIG. 3A shows a case where the first circuit area 101 is an OFF-state area and the second circuit area 102 is an ON-state area. The gate leakage suppression circuit 300 in FIG. 3 includes an input terminal 301 where a signal from the internal circuit of the second circuit area 102 is input. The signal input to the input terminal 301 is then input to a negative logic OR circuit 302. An enable signal is input to the other one of the two input terminals of the negative logic OR circuit 302 through an enable terminal 303.

The enable signal is sent from the internal circuit of the ON-state second circuit area. The input of the enable signal is a negative logic input. The negative logic OR circuit 302 operates by the second power supply voltage VDD 2. The output of the negative logic OR circuit 302 is input to an inverter 304. The inverter 304 operates by the first power supply voltage VDD 1. The output of the inverter 304 is sent to the internal circuit of the first circuit area 101 through an output terminal 305.

The operation of the gate leakage suppression circuit 300 will be explained below. FIG. 3B shows the relationship of an input signal "input" to the input terminal 301, an enable signal "enable" to the enable terminal 303, a signal "M" on the boundary between the ON-state circuit area and the OFF-state circuit area, and an output signal "output" from the output terminal 305. The signal "M" to the OFF-state area is an output signal from the negative logic OR circuit 302 to the inverter 304 in FIG. 3A.

If the first circuit area 101 is OFF and the second circuit area 102 is ON, "0" is input to the enable terminal 303 and the voltage is kept Low. The signal to the inverter 304 is thereby kept Low or "0" regardless of the input signal to the input terminal 301. It is thus able to suppress the gate leakage from the ON-state circuit area to the OFF-state circuit area to reduce power consumption.

If the first circuit area 101 is ON, a High-level voltage, "1", is input as the enable signal. If the input signal from the second circuit area 102 is "0", the boundary voltage "M" is High or "1", and the output signal from the output terminal 305 is "0". If, on the other hand, the input signal from the second circuit area 102 is "1", the boundary voltage "M" is Low or "0", and the output signal from the output terminal 305 is "1". If the input signal and the enable signal are indeterminate, both the boundary voltage and the output signal from the output terminal 305 are indeterminate.

Figure 4A:
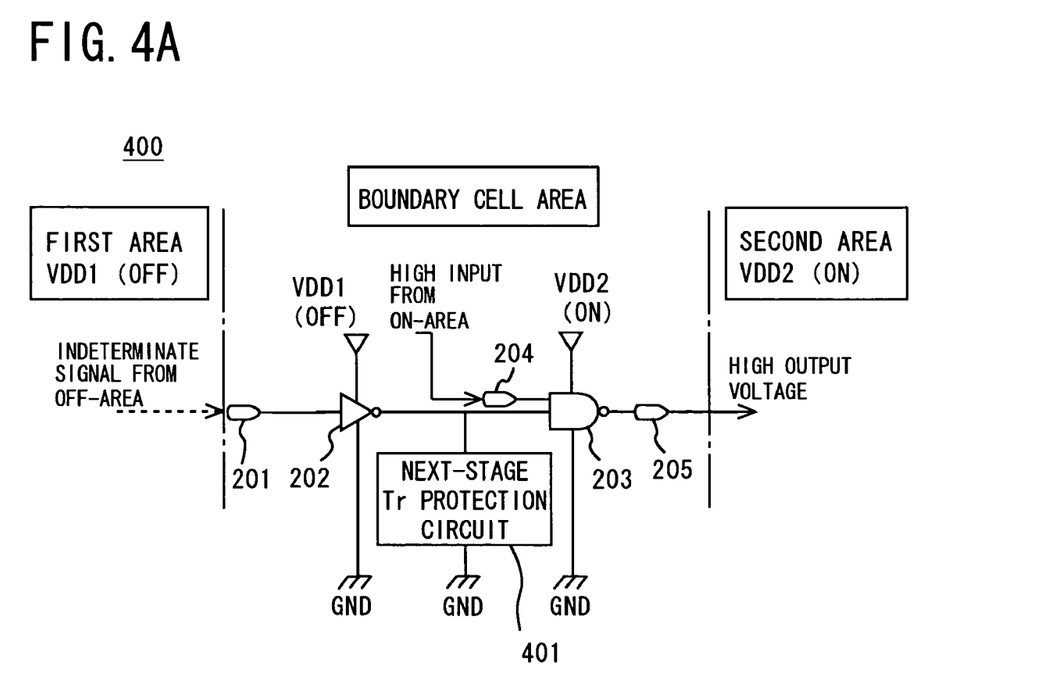
FIG. 4A is a logic circuit diagram showing an ESD protection circuit, which is an example of a boundary circuit according to an embodiment of the present invention.
Figure 4B:
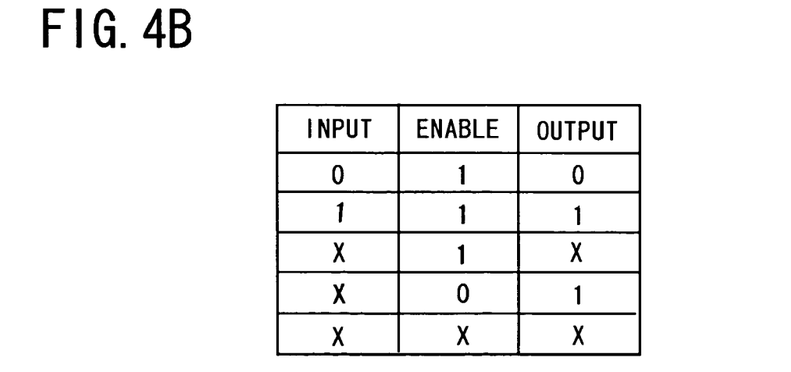
FIG. 4B is a truth table for the ESD protection circuit shown in FIG. 4A.

Referring then to FIGS. 4A and 4B, a boundary circuit 400 including an Electrostatic Discharge (ESD) protection circuit 401 is shown as another example of the boundary circuit. FIG. 4A is a logic circuit diagram showing the circuit configuration of the boundary circuit 400 including the ESD protection circuit 401. FIG. 4B shows a truth table for the boundary circuit 400. The circuit configuration in FIG. 4A is the same as the logic circuit configuration in FIG. 2A except that the ESD protection circuit 401 is added. The truth table in FIG. 4B is the same as that in FIG. 2B. The ESD protection circuit 401 protects a next-stage transistor from ESD. The ESD protection circuit 401 may consist of a diode or a transistor connected between a gate terminal and a ground line of a next-stage transistor, for example. The ESD protection circuit 401 contributes to the prevention of the gate dielectric breakdown of a transistor induced by ESD between circuits of different power supply voltages.

Figure 5A:
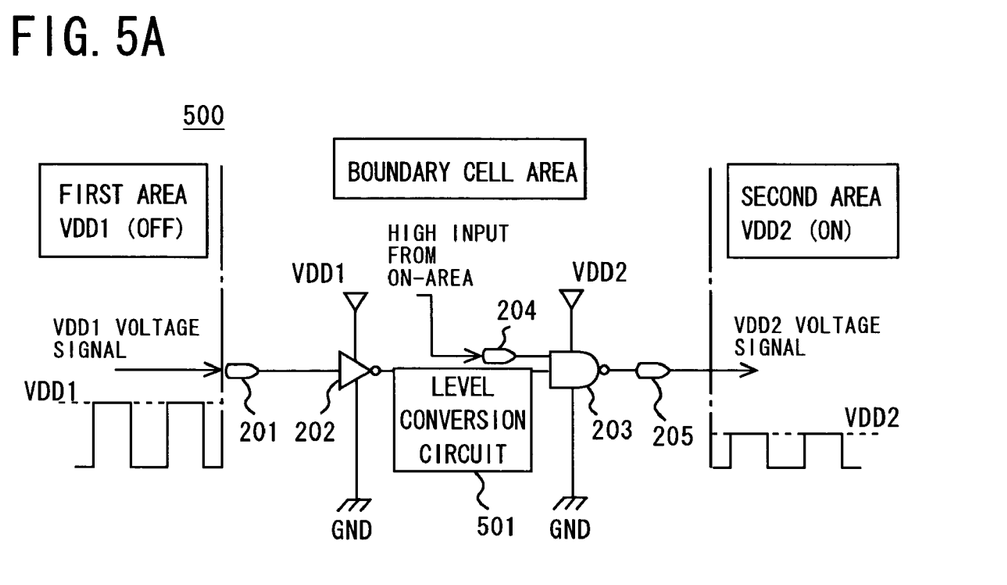
FIG. 5A is a logic circuit diagram showing a level conversion circuit, which is an example of a boundary circuit according to an embodiment of the present invention.
Figure 5B:
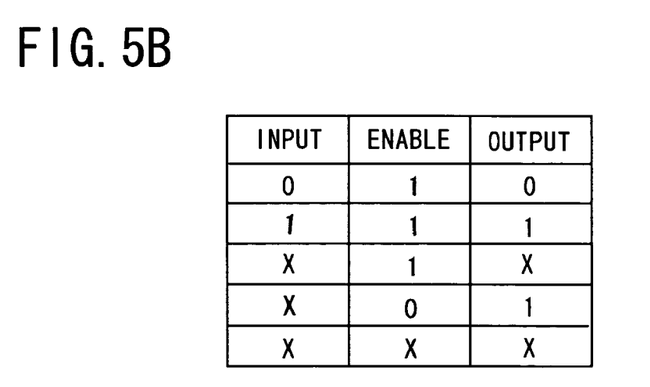
FIG. 5B is a truth table for the level conversion circuit shown in FIG. 5A.

Referring to FIGS. 5A and 5B, a boundary circuit 500 including a level conversion circuit 501 is shown as another example of the boundary circuit. FIG. 5A is a logic circuit diagram showing the circuit configuration of the boundary circuit 500. FIG. 5B shows a truth table for the boundary circuit 500. The circuit configuration in FIG. 5A is the same as the logic circuit configuration in FIG. 2A except that the level conversion circuit 501 is added, and its explanation will be omitted. The truth table in FIG. 5B is the same as that in FIG. 5B, and its explanation will be omitted The level conversion circuit 501 enables signal input and output between two circuit areas with different signal voltage levels. The level conversion circuit 501 is connected between the inverter 202 and the NAND gate 203. The output from the inverter 202 is level-converted by the level conversion circuit 501 and then input to the NAND gate 203. For example, if the first voltage level VDD 1 is higher than the second voltage level VDD 2, the level conversion circuit 501 converts the signal with the voltage of VDD 1 to the signal with the voltage of VDD 2. In the case where either circuit area is not set to OFF, the NAND gate 203 may be replaced with an inverter.

Though several examples of the boundary circuit are shown above, the boundary circuit to which the present invention is applicable is not limited thereto. The above circuits may be inserted between the circuit areas driven by different power systems separately or in combination with others. For example, it is possible to insert the level conversion circuit or the ESD protection circuit without using the shoot-through current suppression circuit. It is also possible to insert the boundary circuit including both the level conversion circuit and the ESD protection circuit. In each boundary circuit, the circuit driven by the first power supply may be viewed as included in the first circuit area, and the circuit driven by the second power supply may be viewed as included in the second circuit area.

Figure 6:
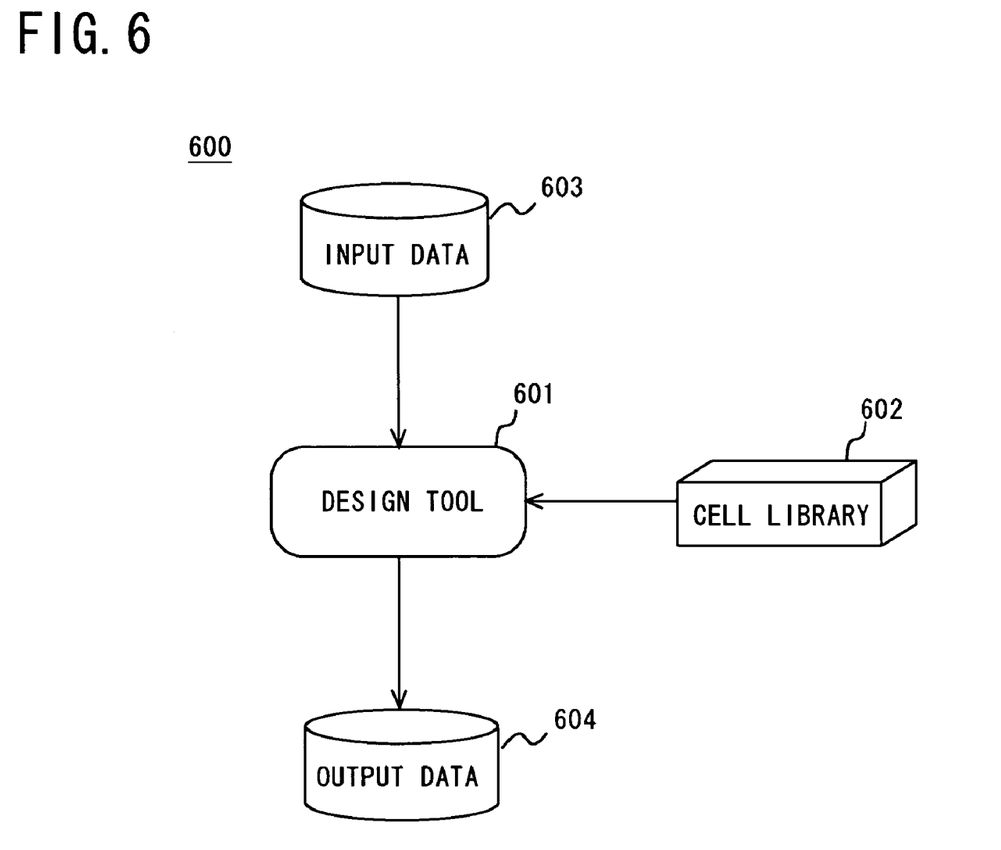
FIG. 6 is a block diagram showing the schematic structure of a design system of a semiconductor circuit device according to an embodiment of the present invention.

Referring now to FIG. 6, a block diagram showing the schematic structure of a design system 600 of a semiconductor circuit device according to an embodiment of the present invention is shown. The design system 600 in FIG. 6 includes design tool program 601, a cell library 602, input data 603 to be input to the design tool 601, and output data 604 to be output from the design tool 601. The design tool 601 generates the output data 604 from the input data 603, referring to the cell library 602. The operation of the design tool 601 and the input and output data will be detailed later. The design system 600 in this embodiment may be used in an appropriate step or phase of the design process of the semiconductor circuit device. For example, the design system 600 may be used in a logic circuit design process and/or a layout design process.

Figure 7:
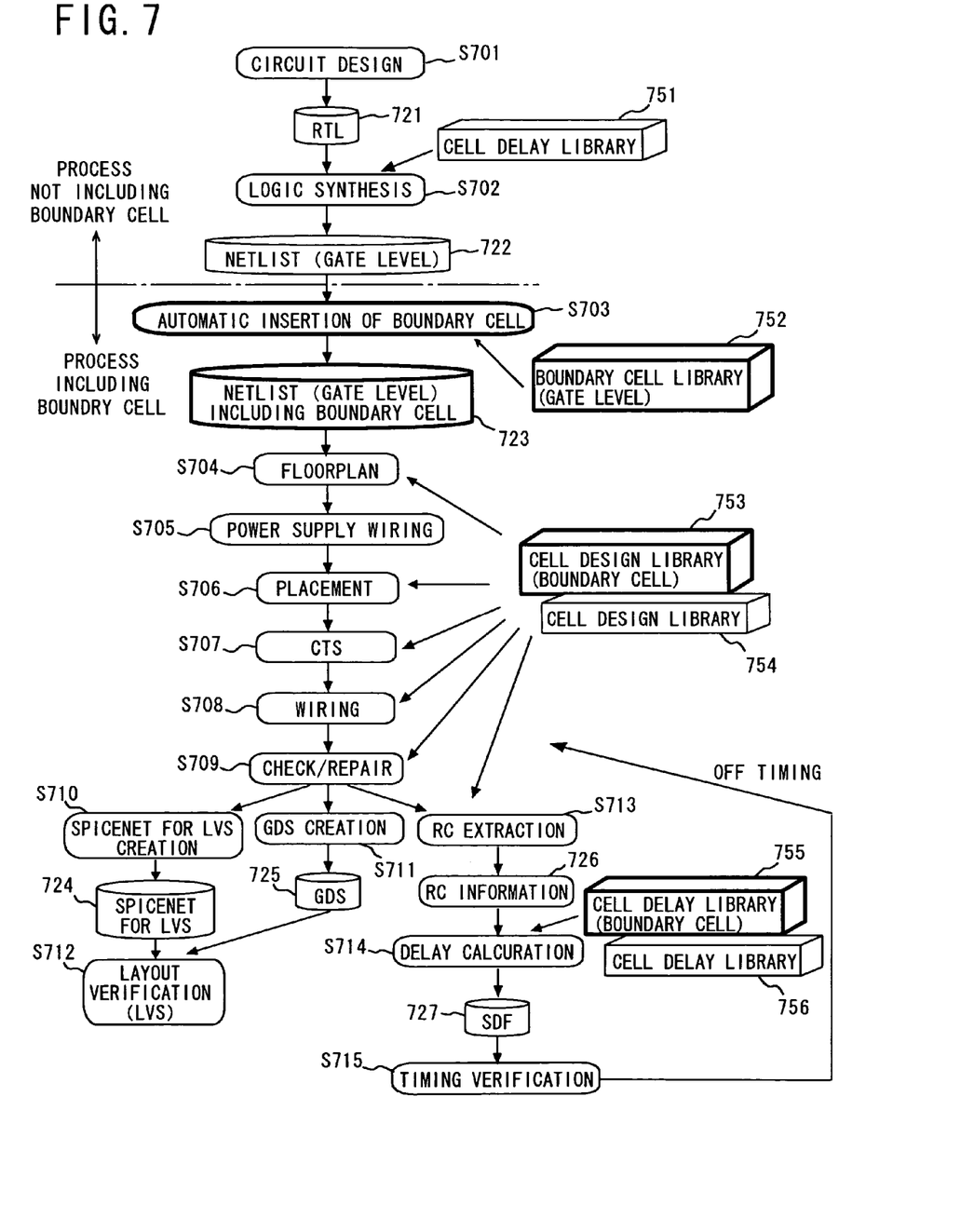
FIG. 7 is a diagram to explain the data processing of a design tool according to an embodiment of the present invention.

Referring to FIG. 7, a diagram to explain the data processing of the design tool 601 according to an embodiment of the present invention is shown. In FIG. 7, an operation performed by the system tool 601 is shown in a quadrilateral box, data generated by the design tool 601 is shown in a cylindrical box, and a cell library previously prepared is shown in a rectangular box. In the case explained below, the design tool 601 performs all the processes shown in FIG. 7.

It is, however, also possible to prepare a plurality of design tools to share the processes in FIG. 7. For example, the design tool to generate a netlist 722 from RTL description 721 and the design tool to perform the later processes may be different.

The cell libraries in this embodiment include boundary cell libraries 752, 753, and 755. The cell contains various circuit information. The boundary cell, which is inserted on the boundary between the circuit areas driven by different power supplies, may have the circuit configurations explained above with reference to FIGS. 2 to 5. The boundary cells may include the cell library 752 for gate level design, the cell library 753 for layout design, and the cell library 755 for verification after the layout design. By previously preparing the boundary circuit as the boundary cell, it is able to further facilitate the designing of the chip.

As shown in FIG. 7, the design tool 601 first performs Register Transfer Level (RTL) circuit design (S701) to generate RTL description 721 from specification data. The RTL description 721 may be written in hardware description languages (HDL) such as Verilog and VHDL. Next, the design tool 601 performs logic synthesis (S702). In the logic synthesis, the input RTL description 721 is converted to gate level, which is then mapped on the cell referring to the cell data in a prestored cell delay library 751. A gate-level netlist 722 is thereby created. The netlist is the data containing circuit information and circuit connection information.

Then, the design tool 601 inserts the boundary cell into the gate-level netlist 722, referring to the gate level boundary cell library 752. The design tool 601 specifies the circuit areas with different power supplies in the gate-level netlist 722 and inserts an appropriate boundary cell as designed on a signal transmission path between the circuit areas. The boundary cell to be inserted may be the shoot-through current suppression circuit cell, the leakage current suppression circuit cell, or a level shifter, for example. A gate-level netlist 723 including the boundary cell is thereby created. The netlist contains boundary circuit information and boundary circuit connection information in addition to information on a plurality of circuit areas driven by different power systems. The gate-level cell libraries 751 and 752 contain information on cell functions, delays, and input/output pins, for example.

After that, a layout design process and a verification process are performed. The cell design library is referred to in each phase. The cell design library has a cell design library 753 of a boundary cell in addition to a conventional cell design library 754. The cell design library contains information on cell shape and size, pin arrangement, and so on. In the layout design process, firstly, floorplan (S704) is performed for rough cell placement so that the circuit can be placed within the chip.

Then, wiring of the power supply line (S705) is performed. After the wiring, cell placement (S706) is performed according to the connections. Then, Clock Tree Synthesis (S707) is performed to design a clock network in such a way that clock skew and so on are within the limits of the design. The wiring (S708) is then performed.

Then, check/repair (S709) is performed. After that, SpiceNet 724 for layout versus schematic (LVS) verification is generated (S710). Further, GDS format layout data 725 is generated (S711). Using the SpiceNet 724 and the GDS layout data 725, the LVS verification is performed (S712) to verify that the layout and the schematic are matched.

Meanwhile, RC extraction (S713) is performed to generate RC information 726 including information on line resistance and parasitic capacitance. Using the RC information 726 and the cell delay library for verification, delay calculation (S714) is performed. The cell delay library for verification has the cell delay library 755 of the boundary cell in addition to a conventional cell delay library 756. The cell delay library contains information required for the delay calculation. Standard Delay Format (SDF) file 727 is created by the delay calculation (S714) and timing verification (S715) is performed. If the timing is off, the process goes back to the placement and wiring phase.

Each of the above operations may be performed automatically by the tool or performed interactively according to the input from the outside world via an interface, such as user input. For example, the design system may automatically perform the detection of the circuit areas with different power systems and the generation of the circuit data with the boundary cell inserted according to the input data. Alternatively, the design system may create a netlist, which is the circuit data with the boundary cell inserted, in response to the input from a user. The insertion of the boundary cell may be performed on any appropriate phase in the design process, and it is not necessarily performed immediately after the creation of the logic circuit netlist 722.

Figure 8:
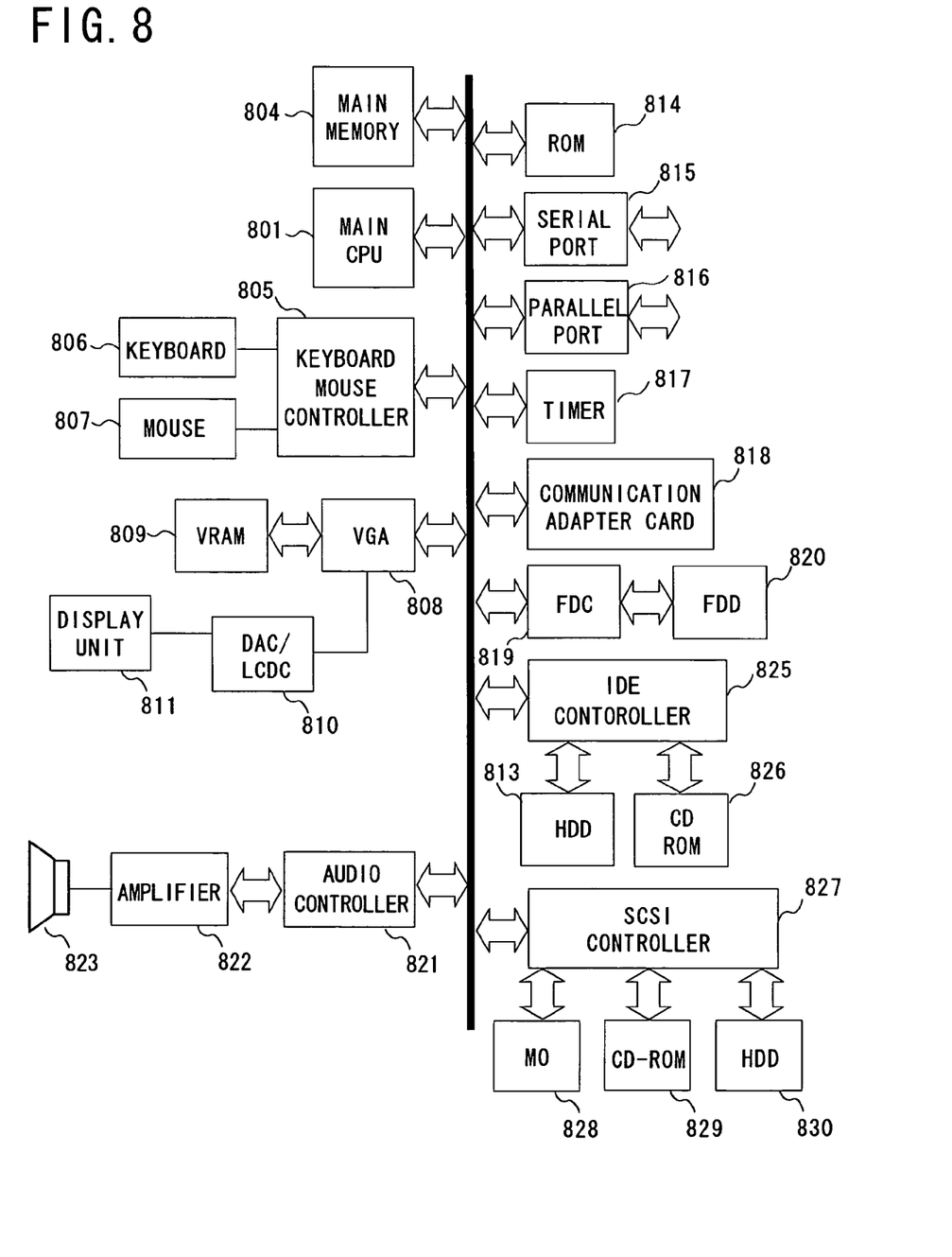
FIG. 8 is a block diagram showing the hardware configuration for implementing a design system according to an embodiment of the present invention.

The design system 600 in this embodiment may be implemented by using hardware logic or by running necessary software program on hardware. FIG. 8 shows an example of a hardware configuration capable of implementing the program. As shown in FIG. 8, the configuration includes a central processing unit (CPU) 801 and memory 804. The CPU and the memory are connected to a hard disk unit 813, which serves as an auxiliary storage unit, via a bus. Storage medium drive units such as a flexible disk unit 820, a hard disk unit 813, and a CD-ROM drive 829 are connected to the bus via controllers such as a flexible disk controller 819, an IDE controller 825, and a SCSI controller 827. The cell library or the input/output data may be stored in the storage unit.

A portable storage medium such as a flexible disk is installed to a storage medium drive unit such as the flexible disk unit. The storage medium may store computer program to give a command to the CPU 801 and so on in collaboration with an operating system so as to implement the present embodiment. The computer program is executed by being loaded into the memory 804. The computer program may be stored in the storage medium by being compressed or broken up into several sections.

The hardware configuration may further include user interface hardware. Examples of the user interface hardware are a pointing device such as a mouse 807 or a joystick and a keyboard 806 for input, and a display 811 for presenting visual data to users. A printer may also be connected via a parallel port 816. Further, a modem may be connected via a serial port, and connection with a network is established via the serial port, modem or token-ring, and a communication adapter 818, thereby communicating with other computer systems. This configuration is an example, and the present embodiment does not necessarily have all the components described here.

As described in the foregoing, the present invention provides efficient design technique for the semiconductor circuit device.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A method of designing a semiconductor circuit device, comprising the steps of:
    generating first circuit data comprising information on a first circuit driven by a voltage from a first power system;
    generating second circuit data comprising information on a second circuit driven by a voltage from a second power system different from the first power system;
    obtaining cell data prestored in a storage medium and comprising information on a boundary circuit; and
    generating boundary circuit connection information indicating that the boundary circuit is connected on a transmission path between the first circuit and the second circuit wherein the boundary circuit comprises a suppressing circuit for suppressing shoot-through current of a boundary between the first circuit and the second circuit, said suppressing circuit including a logic circuit receiving an enable signal in a first state from one of said first circuit and second circuit which is ON for suppressing said shoot-through current of the boundary between said first circuit and second circuit when the other of said first circuit and second circuit is OFF, and receiving an enable signal in a second state for enabling signal transfer between said first and second circuits when each of said first and second circuits are ON.

2. The method of designing a semiconductor circuit device according to claim 1, wherein the boundary circuit further comprises a circuit for level conversion between the first circuit and the second circuit.

3. The method of designing a semiconductor circuit device according to claim 1, wherein the boundary circuit further comprises a protection circuit for protecting a transistor in the first circuit and/or the second circuit from electrostatic discharge.

4. The method of designing a semiconductor circuit device according to claim 1, wherein the first circuit data, the second circuit data, and the cell data are data for logic circuit design.

5. The method of designing a semiconductor circuit device according to claim 1, wherein the first circuit data, the second circuit data, and the cell data are data for layout design.

6. The semiconductor circuit device designed by a method of designing a semiconductor circuit device according to claim 1.

7. A method of designing a semiconductor circuit device, comprising the steps of:
    generating first circuit data comprising information on a first circuit driven by a voltage from a first power system;
    generating second circuit data comprising information on a second circuit driven by a voltage from a second power system different from the first power system;
    obtaining cell data prestored in a storage medium and comprising information on a boundary circuit; and
    generating boundary circuit connection information indicating that the boundary circuit is connected on a transmission path between the first circuit and the second circuit
    wherein the boundary circuit comprises a circuit for preventing circuit malfunction due to an indeterminate signal between the first circuit and the second circuit when a power supply of the first circuit is OFF, and a power supply of the second circuit is ON.

8. A method of designing a semiconductor circuit device, comprising the steps of:
generating first circuit data comprising information on a first circuit driven by a voltage from a first power system;
generating second circuit data comprising information on a second circuit driven by a voltage from a second power system different from the first power system;
obtaining cell data prestored in a storage medium and comprising information on a boundary circuit; and
generating boundary circuit connection information indicating that the boundary circuit is connected on a transmission path between the first circuit and the second circuit
wherein the boundary circuit comprises a suppressing circuit for suppressing leakage current of a boundary between the first circuit and the second circuit, said suppressing circuit including a logic circuit receiving an enable signal in a first state from one of said first circuit is and second circuit which is ON for suppressing said leakage current of the boundary between said first circuit and second circuit when the other of said first circuit and second circuit is OFF, and receiving an enable signal in a second state for enabling signal transfer between said first and second circuits when each of said first and second circuits are ON.

* * * * *